United States Patent
Kim et al.

(10) Patent No.: US 7,522,416 B2
(45) Date of Patent: Apr. 21, 2009

(54) DISPLAY DEVICE AND BLOWER THEREOF

(75) Inventors: Wook Kim, Seoul (KR); Jun Ho Bae, Seoul (KR); Chang Joon Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/318,549

(22) Filed: Dec. 28, 2005

(65) Prior Publication Data

US 2006/0164804 A1    Jul. 27, 2006

(30) Foreign Application Priority Data

Dec. 29, 2004    (KR) .................... 10-2004-0115322

(51) Int. Cl.
  *H05K 7/20*    (2006.01)
  *H05K 5/00*    (2006.01)
  *G02F 1/1333*  (2006.01)
(52) U.S. Cl. .................... 361/695; 361/690; 349/58; 454/184
(58) Field of Classification Search ................ None
   See application file for complete search history.

(56) References Cited

U.S. PATENT DOCUMENTS

| | | | |
|---|---|---|---|
| 4,652,101 A | | 3/1987 | Grunwald |
| 4,851,965 A | * | 7/1989 | Gabuzda et al. ............ 361/691 |
| 4,907,645 A | * | 3/1990 | Dumas et al. ............... 165/41 |
| 5,127,238 A | * | 7/1992 | Ichikawa et al. ............. 62/244 |
| 5,335,721 A | * | 8/1994 | Wollaber et al. ............ 165/122 |
| 6,047,765 A | * | 4/2000 | Zhan ......................... 165/80.3 |
| 6,493,222 B2 | * | 12/2002 | DiFonzo et al. ............ 361/687 |
| 6,493,440 B2 | * | 12/2002 | Gromatzky et al. ......... 379/161 |
| 6,511,291 B2 | * | 1/2003 | Koochingchai ............. 415/229 |
| 6,603,938 B2 | * | 8/2003 | Tsubakimoto ............... 399/92 |
| 6,903,928 B2 | * | 6/2005 | Lopatinsky et al. ......... 361/697 |
| 6,967,842 B2 | * | 11/2005 | Aoki et al. .................. 361/701 |
| 6,975,509 B2 | * | 12/2005 | Osborn et al. ............... 361/687 |
| 2004/0223299 A1 | * | 11/2004 | Ghosh ........................ 361/687 |
| 2005/0053468 A1 | * | 3/2005 | Kuan ........................... 417/32 |
| 2006/0114653 A1 | * | 6/2006 | Seto et al. ................... 361/695 |
| 2007/0103866 A1 | * | 5/2007 | Park ........................... 361/695 |

FOREIGN PATENT DOCUMENTS

| | | |
|---|---|---|
| DE | 3506968 | 10/1985 |
| EP | 0846869 A | 6/1998 |

(Continued)

OTHER PUBLICATIONS

English language Abstract of JP 2-251987.

(Continued)

*Primary Examiner*—Boris L Chervinsky
(74) *Attorney, Agent, or Firm*—Greenblum & Bernstein, P.L.C.

(57) ABSTRACT

A display device, and a blower thereof are disclosed. The display device includes an axial flow fan within a case, which has a display panel encased therein. The axial flow fan is provided in a width direction within the case, so that, while being rotated within the case, the axial flow fan generates forced air flow suitable to the case. The forced air flow is generated in a forward direction along with air flow by natural convection within the case.

13 Claims, 8 Drawing Sheets

FOREIGN PATENT DOCUMENTS

| | | |
|---|---|---|
| JP | 2-251987 | 10/1990 |
| JP | 3-022595 | 1/1991 |
| JP | 3-164787 | 7/1991 |
| JP | 2001-272919 | 10/2001 |
| JP | 2003-029648 | 1/2003 |

OTHER PUBLICATIONS

English language Abstract of JP 2003-029649.
English language Abstract of JP 3-022595.
English language Abstract of JP 2001-272919.
English language Abstract of JP 3-164787.
English language Abstract of DE 3506968.
"Data Sheet of Cooling Fans Manufactured by the Company EMB-PAPST," retrieved on Nov. 30, 2007 from the Internet and submitted by the applicant in the course of the written procedure of European Patent Application No. 05028406.6.

* cited by examiner

DISPLAY DEVICE AND BLOWER THEREOF

BACKGROUND OF THE INVENTION

1. Field of the Invention

The present invention relates to a display device, and a blower thereof. More particularly, the present invention relates to a display device, and a blower thereof, which comprise an axial flow fan equipped within a thin and wide case so as to allow suitable heat dissipation from the case of the display device.

2. Description of the Related Art

Generally, display devices refer to apparatuses for displaying characters or images, and are generally classified into a cathode ray tube, and a flat panel display having lower weight and volume than the cathode ray tube.

Display panels for the flat panel display include a liquid crystal display panel (LCD), a field emission display panel (FED), a plasma display panel (PDP), and an electro-luminescence (EL) display panel.

The PDP refers to an apparatus to display images through plasma discharge. Since the PDP has a high response rate, and can be manufactured in large scale to display images, it has been recently increased in application to high definition television sets or monitors, and indoor or outdoor display devices for advertisement.

Since the display panel, and electronic components of a driving unit for the display panel in the display device generates a large quantity of heat, the display device can be changed in its performance according to heat dissipation efficiency.

Figure 1:
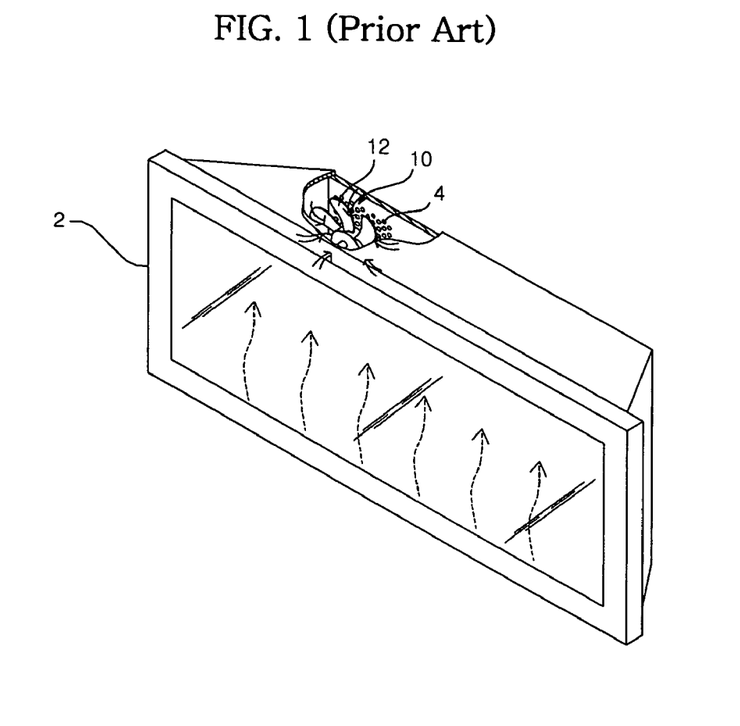
FIG. 1 is a perspective view illustrating a conventional display device.
Figure 2:
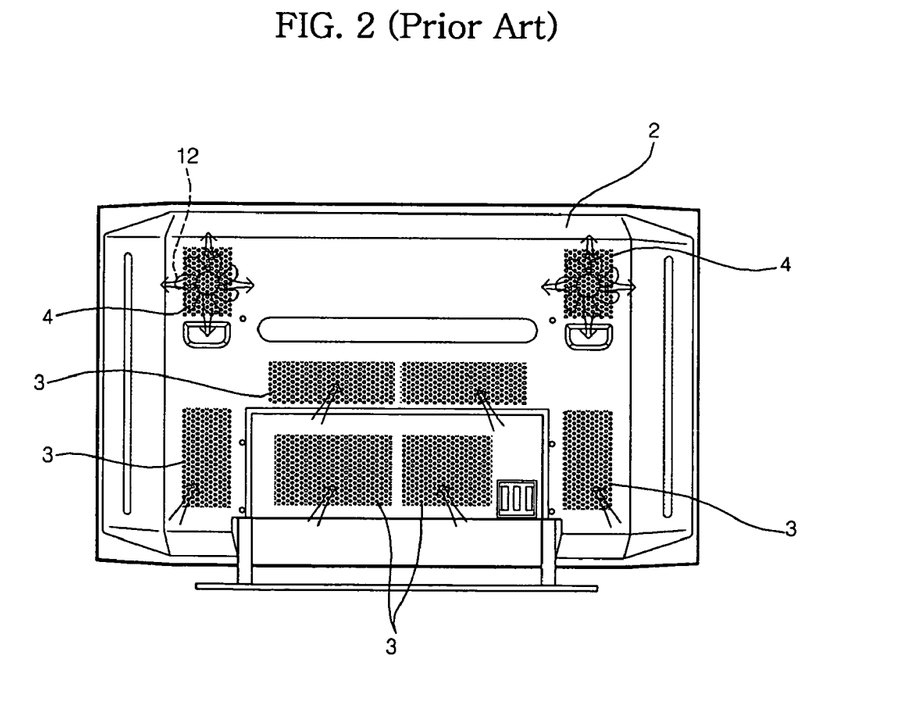
FIG. 2 is a side view of the conventional display device.
Figure 3:
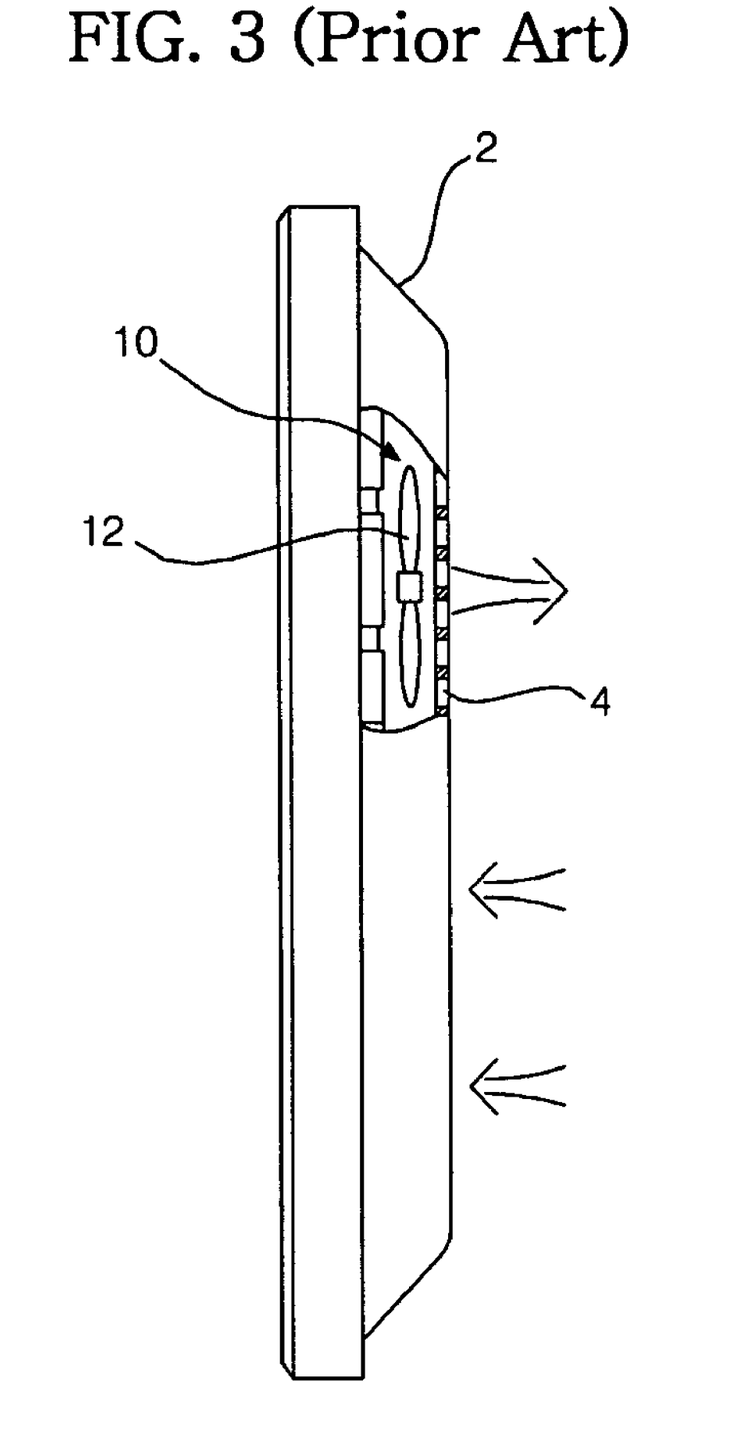
FIG. 3 is a rear view of the conventional display device.

FIG. 1 is a perspective view illustrating a conventional display device, FIG. 2 is a side view of the conventional display device, and FIG. 3 is a rear view of the conventional display device.

In FIGS. 1 to 3, the display device includes a thin and wide case 2, which has a display panel encased therein.

For heat dissipation of the display device, the case 2 is formed with an air inlet 3 through which external air can be induced to the case 2, and an air outlet 4 through which internal air can be discharged to an outside of the case 2.

Specifically, the case 2 may have a plurality of air inlets 3 formed at a lower side of the case 2, and a plurality of air outlets 4 formed at an upper side of the case 2.

The case 2 is provided therein with a blower 10 to efficiently discharge heat from an interior of the case 2 to the outside.

The blower 10 comprises axial flow fans 12, and fan motors (not shown) to rotate the axial flow fans 12.

Since the case 10 has a thin and wide structure, it typically has at least two axial flow fans 12 such that a shaft of each axial flow fan 12 is disposed in a front and rear direction of the case 2.

Each of the fan motors is also disposed in the front and rear direction of the case 2, and directly connected with an associated axial flow fan 12, or disposed above or below the axial flow fan 12, and is indirectly connected thereto via a belt-pulley.

In the display device constructed as described above, heat dissipation is performed in such a way that external air is induced into the case 2 through the air inlets 3, while internal air is discharged to the outside through the air outlets 4.

In particular, when the axial flow fans 4 are rotated by driving force of the fan motors, forced air flow is generated by the axial flow fans 4 so that heat is efficiently discharged to the outside from the interior of the case 2.

However, according to the conventional display device, since it is necessary to arrange the plural axial flow fans 4 within the case 2 so as to obtain uniform heat dissipation of the case 2, the case 2 has a complicated structure, and is increased in its dimensions, thereby increasing manufacturing costs.

In addition, even if the plural axial flow fans 4 are provided to the case 2, a dead zone is inevitably formed within the case 2, where a blowing force of the axial flow fans 4 is not sufficiently applied, so that the conventional display device suffers from weak heat dissipation efficiency.

Moreover, in the conventional display device, flow resistance is increased due to collision between the forced air flow by the axial flow fans 4 and air flow by natural convection, and between the forced air flows by the axial flow fans 4, causing weak heat dissipation efficiency and severe noise.

Moreover, the plural axial flow fans 4 are equipped within the case 2 of the conventional display device, so that the air inlets 3 and the air outlets 4 occupy significantly large areas on the case 2, causing direct noise radiation from electronic components for a driving unit within the case 2.

Furthermore, in the case where the axial flow fans 4 are directly connected with the fan motors, respectively, the case 2 is inevitably thickened, and in the case where the axial flow fans 4 are indirectly connected with the fan motors via the belt-pulley, a connecting structure between the axial flow fans 4 and the fan motors is further complicated along with an increase in manufacturing costs, in spite of relative decrease in thickness of the case 2.

SUMMARY OF THE INVENTION

The present invention has been made to solve the above problems, and it is an object of the present invention to provide a display device and a blower thereof, which comprise a single axial flow fan within a case to discharge heat from the interior of the case, thereby minimizing the size (particularly, thickness) of the case while ensuring sufficient heat dissipation only with the single axial flow fan.

It is another object of the present invention to provide a display device and a blower thereof, which comprise a single axial flow fan provided to an upper portion within a case of the display device such that forced air flow by the axial flow fan is forwardly generated along with air flow by natural convection, thereby maximizing heat dissipation efficiency while minimizing noise.

It is yet another object of the present invention to provide a display device and a blower thereof, which can be minimized in dimensions (particularly, thickness) of a case even if a fan motor for rotating an axial flow fan is directly connected with the axial flow fan.

In accordance with one aspect of the present invention, the above and other objects can be accomplished by the provision of a display device, comprising: a case having a display panel encased therein; and an axial flow fan to suck internal air in the case and discharge the air from the case to an outside thereof.

Preferably, the display panel is a flat display panel.

Preferably, the case has a thickness smaller than a width.

Preferably, the case has an air outlet formed at an upper side to allow air to be discharged from an interior of the case to the outside therethrough.

Preferably, the case has an upper surface, at least a rear portion of which is slanted from a front side towards a rear side.

Preferably, the case has an air inlet formed at a lower side to allow air to be induced from the outside into the case therethrough.

Preferably, the axial flow fan is equipped at an upper portion within the case.

Preferably, the display further comprises a fan motor arranged in line with the axial flow fan in an axial direction of the axial flow fan to drive the axial flow fan.

In accordance with another aspect of the present invention, a display device is provided, which comprises: a case encasing a display panel therein and having an air outlet formed thereon; and a blower to suck internal air in the case so as to flow upwardly within the case, and to discharge the sucked air through the air outlet.

Preferably, the display panel is a flat display panel.

Preferably, the case has a thickness smaller than a width.

Preferably, the air outlet is formed at an upper side of the case.

Preferably, the case has an upper surface, at least a rear portion of which is slanted from a front side towards a rear side.

Preferably, the case has an air inlet formed at a lower side to allow air to be induced from the outside into the case therethrough.

Preferably, the blower is equipped at an upper portion within the case.

Preferably, the blower comprises an axial flow fan.

Preferably, the blower comprises an axial flow fan, and a fan motor arranged in line with the axial flow fan in an axial direction of the axial flow fan to drive the axial flow fan.

In accordance with yet another aspect of the present invention, a blower for a display device is provided, wherein the blower is equipped within a case having a display panel encased therein, and comprises an axial flow fan to suck internal air in the case and to discharge the sucked air to an outside of the case, the case having a thickness smaller than a width.

Preferably, the display panel is a flat display panel.

Preferably, the axial flow fan is equipped at an upper portion within the case.

For the display device and the blower thereof according to the present invention, since the axial flow fan is provided for discharging internal air from the case to the outside thereof, forced air flow is widely generated by the axial flow fan, thereby enhancing heat dissipation of the display device via uniform heat dissipation inside the case.

In addition, sufficient heat dissipation can be obtained only with a single axial flow fan within the case, simplifying the construction of the display device, minimizing the overall size thereof, reducing manufacturing costs thereof, and minimizing noise and flow resistance due to collision between the flows inside the case. Moreover, since the air inlet and outlet occupy smaller areas on the case, there is an advantage in that noise radiation from the case is reduced.

In addition, the axial flow fan is equipped at the upper portion within the case, so that the forced air flow by the axial flow fan is forwardly generated along with the air flow by natural convection, thereby maximizing heat dissipation efficiency while minimizing noise of the display device.

In addition, even if the fan motor for rotating the axial flow fan is directly connected with the axial flow fan, it is possible to minimize the thickness of the case, while simplifying the construction of the display device and maximally reducing the manufacturing costs thereof.

In addition, the case has the upper surface, at least a rear portion of which is slanted downwardly towards the rear side of the case, and the air outlet formed on the downwardly slanted upper surface of the case, so that air discharged through the air outlet of the case flows towards the rear side of the case.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Preferred embodiments of the present invention will be described in detail with reference to the accompanying drawings.

Although the display device of the present invention may be either a cathode ray tube or a flat panel display, the following description will be limited to the flat panel display comprising a flat display panel such as a PDP, which has been recently applied to the display device.

Figure 4:
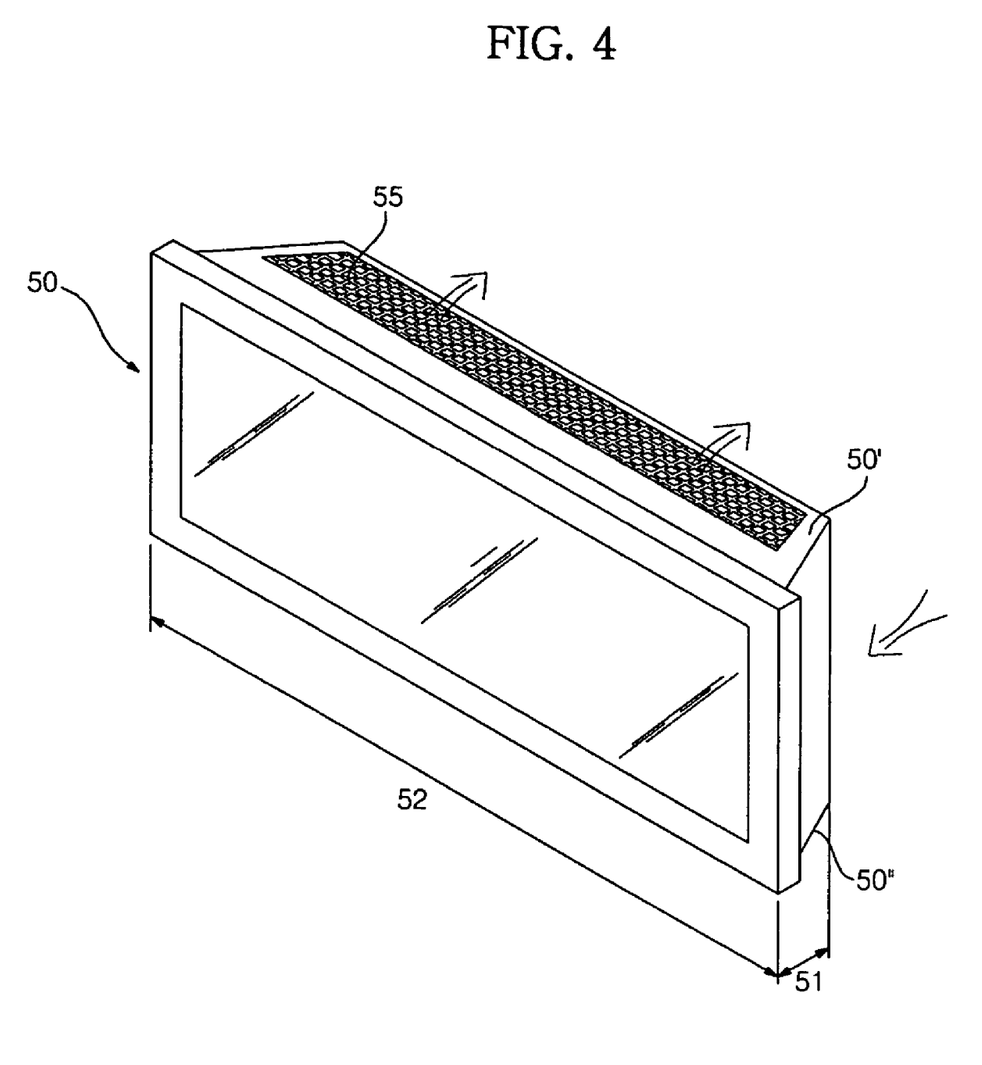
FIG. 4 is a perspective view illustrating a display device and a blower thereof in accordance with a first embodiment of the present invention.
Figure 5:
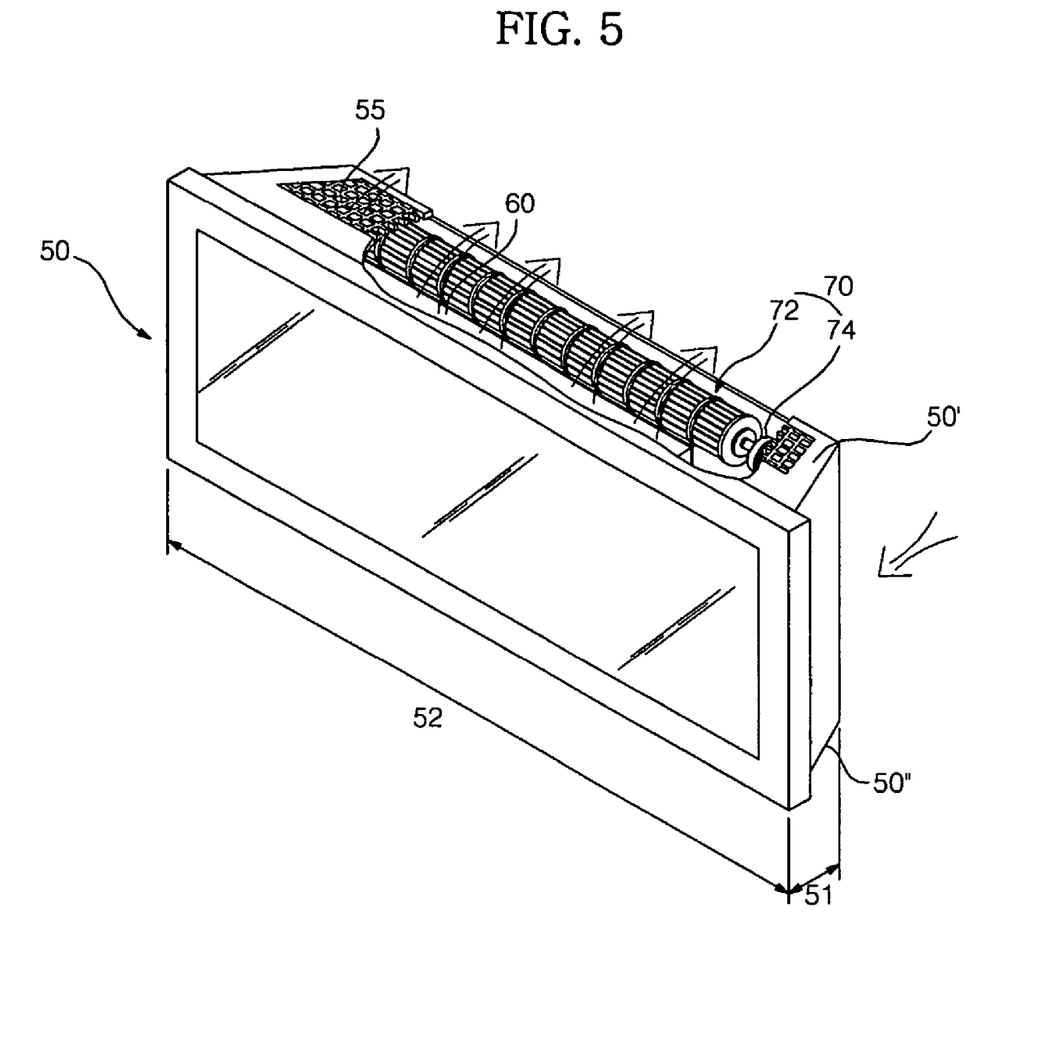
FIG. 5 is a perspective view of the display device and the blower thereof of FIG. 4 in which a component of the display device is partially cut away.
Figure 6:
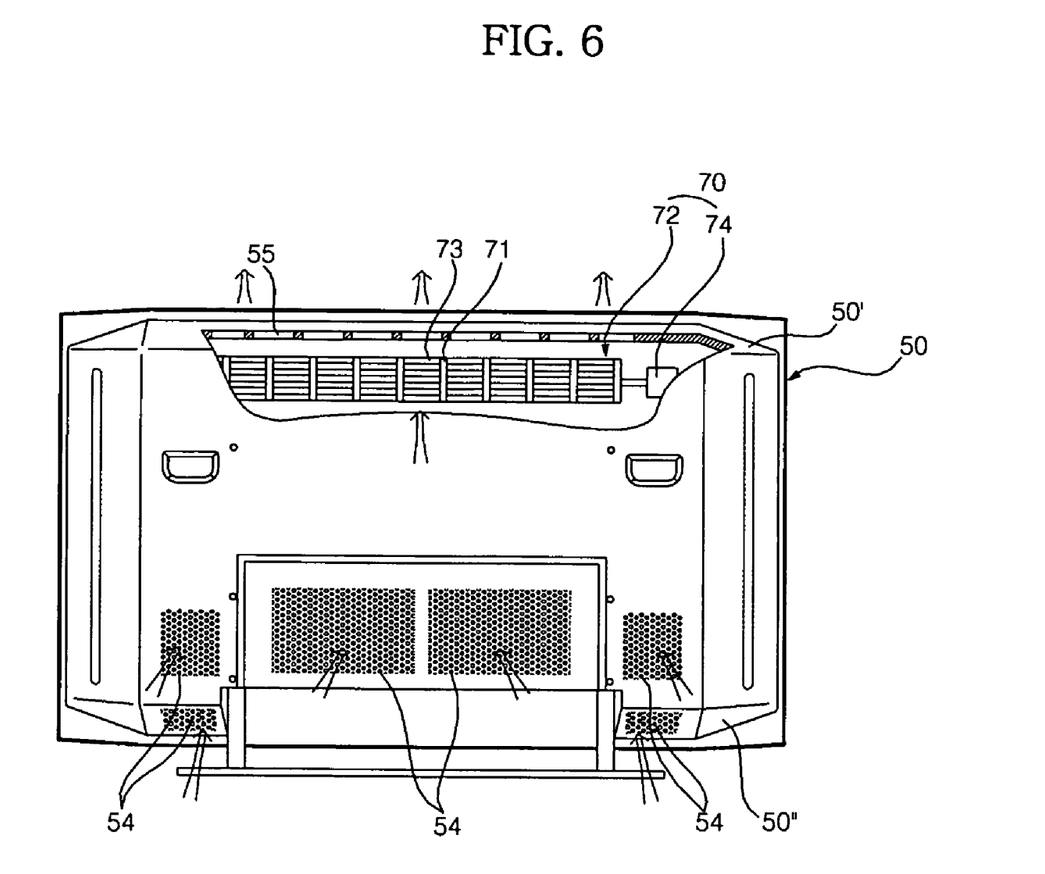
FIG. 6 is a side view illustrating the display device and the blower thereof in accordance with the first embodiment.
Figure 7:
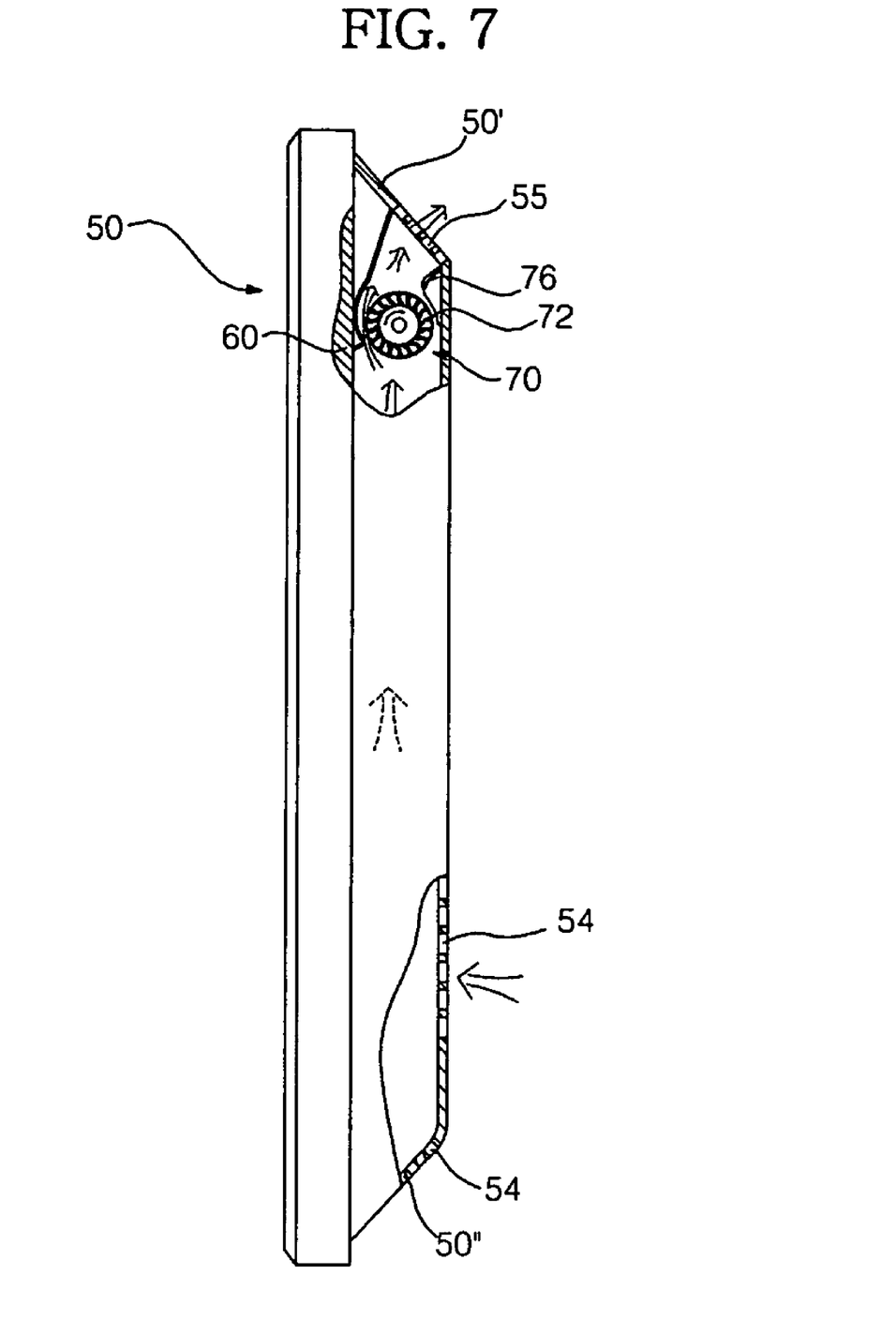
FIG. 7 is a rear view illustrating the display device and the blower thereof in accordance with the first embodiment.

FIG. 4 is a perspective view illustrating a display device and a blower thereof in accordance with a first embodiment of the present invention, FIG. 5 is a perspective view of the display device and the blower thereof of FIG. 4 in which a component of the display device is partially cut away, FIG. 6 is a side view illustrating the display device and the blower thereof in accordance with the first embodiment, and FIG. 7 is a rear view illustrating the display device and the blower thereof in accordance with the first embodiment.

Referring to FIGS. 4 to 7, the display device includes a thin and wide case 50, which has a flat display panel 60, such as PDP, encased therein.

In other words, the case 50 may have a thickness 51 significantly smaller than a width 52, in which the thickness 51 is a length of the case 50 in a front and rear direction, and the width 52 is a length of the case 50 in a left and right direction.

In addition, the case 50 may have an upper surface, at least a rear portion 50' of which is slanted downwardly from the front side to the rear side of the case 50.

In addition, the case 50 may have a lower surface, at least a rear portion 50" of which is slanted upwardly from the front side to the rear side of the case 50.

The case 50 is formed thereon with holes through which air flows to discharge heat from the interior of the case 50 to the outside thereof.

The holes formed on the case 50 may constitute an air inlet 54 through which external air is induced to the case 50, and an air outlet 55 through which internal air is discharged to the outside of the case 50.

The air inlet 54 may be formed at a lower side of the case 50.

Specifically, the air inlet 54 is formed at a lower portion of the rear side of the case 50.

In addition, since the at least rear portion 50" of the lower surface of the case 50 can be spaced from a floor on which the case 50 is positioned, the air inlet 54 may be formed at the at least rear portion 50" of the lower surface of the case 50.

The case 50 may comprise a single elongated air inlet 54 formed in the left and right direction of the case 50, or comprise a plurality of air inlets 54 arranged in parallel to each other in the left and right direction of the case 50 as shown in the drawings.

Preferably, the air inlet 54 has a grill structure or a mesh structure, and is constructed of a plurality of holes in order to prevent foreign substances from entering the interior of the case 50. In addition, the air inlet 54 of the case 50 may be provided with a filter for preventing entrance of the foreign substances.

The air outlet 55 may be formed at an upper side of the case 50.

Specifically, the air outlet 55 is formed at a rear portion 50' of the upper surface of the case 50, so that air discharged through the air outlet 55 flows away from the back of the case 50.

Although not shown in the drawings, additional air outlets 55 may be formed at upper sides of the right and left sides of the case 50.

As shown in the drawings, the case 50 may comprise a single elongated air outlet 55 formed in the left and right direction of the case 50, or comprise a plurality of air outlets 55 arranged in parallel to each other in the left and right direction of the case 50.

Preferably, the air outlet 55 also has a grill structure or a mesh structure, and is constructed of a plurality of holes in order to prevent foreign substances from entering the interior of the case 50. In addition, the air outlet 55 of the case 50 may be provided with a filter for preventing entrance of the foreign substances.

Meanwhile, a blower 70 is provided within the case 50 to allow more efficient heat dissipation from the case 50.

The blower 70 comprises an axial flow fan 72 to generate forced air flow while being rotated within the case, and a fan motor 74 to rotate the axial flow fan 72.

The axial flow fan 72 comprises a plurality of fan plates 71 arranged in an axial direction of the axial flow fan 72, and a plurality of fan blades 73 radially arranged between the fan plates 71.

The axial flow fan 72 has a shaft disposed in a width direction of the case 50, i.e. in the left and right direction of the case 50 such that internal air in the case 50 is sucked to the axial flow fan 72 while flowing upwardly within the case 50.

In addition, the axial flow fan 72 may be positioned at an upper portion within the case 50 such that the forced air flow by the axial flow fan 72 is uniformly delivered to every corner within the case 50.

The fan motor 74 may be directly connected with the axial flow fan 72, or indirectly connected therewith via a belt-pulley. In this regard, the following description will be limited to the case where the fan motor 74 is directly connected with the axial flow fan 72.

When being directly connected with the axial flow fan 72, the fan motor 74 is arranged in line with the axial flow fan 72 in the axial direction of the axial flow fan 72.

At this time, two fan motors 74 may be provided to both left and right sides of the axial flow fan 72, and alternatively, as shown in the drawings, a single fan motor 74 may be provided to one of the left and right sides of the axial flow fan 72.

Meanwhile, the blower 70 may further comprise a fan housing 76, which is positioned at an outside of the axial flow fan 72 so as to guide the air flow.

In other words, the fan housing 76 allows internal air in the case 50 to be sucked to the axial flow fan 72, while allowing the air sucked to the axial flow fan 72 to be discharged to the air outlet 55 of the case 50.

Heat dissipation of the display device and the blower thereof according to the first embodiment constructed as described above will be described as follows.

Air flow is generated by natural convection within the case 50, causing external air to be induced from the outside to the case 50, and internal air in the case 50 to be discharged to the outside of the case 50.

In particular, when the fan motor 74 is driven to rotate the axial flow fan 72, forced air flow is generated by the axial flow fan 72 within the case 50 so that heat is more efficiently discharged from the interior of the case 50 to the outside.

In other words, the external air is forcibly induced to the case 50 through the air inlet 54 of the case 50. The internal air in the case 50 is sucked to the axial flow fan 72 while flowing upwardly within the case 50. The air sucked to the axial flow fan 72 is discharged to the air outlet 55 of the case 50 from the axial flow fan 72. The air discharged to the air outlet 55 of the case 50 is forcibly discharged to the outside of the case 50 through the air outlet 55 of the case 50.

For the display device and the blower thereof according to the first embodiment constructed and operated as described above, the forced air flow is widely generated in the width direction by the axial flow fan 72 within the case 50 so as to constitute forward air flow along with the air flow caused by the natural convection within the case 50, and the axial flow fan 72 is positioned at the upper portion within the case 50, thereby allowing heat to be efficiently discharged from the interior of the case 50, and reducing noise caused by collision between the flows.

In addition, since the fan motor 74 is directly connected with the axial flow fan 72, the display device is simplified in construction, and reduced in manufacturing costs. In this case, although the fan motor 74 is directly connected with the axial flow fan 72, the size (particularly, the thickness) of the case 50 is not significantly influenced.

In addition, the display device has the single axial flow fan 72, so that an area of the air outlet 55 is further reduced on the case 50 in comparison to the conventional display panel, thereby remarkably reducing noise radiation from the case 50.

Figure 8:
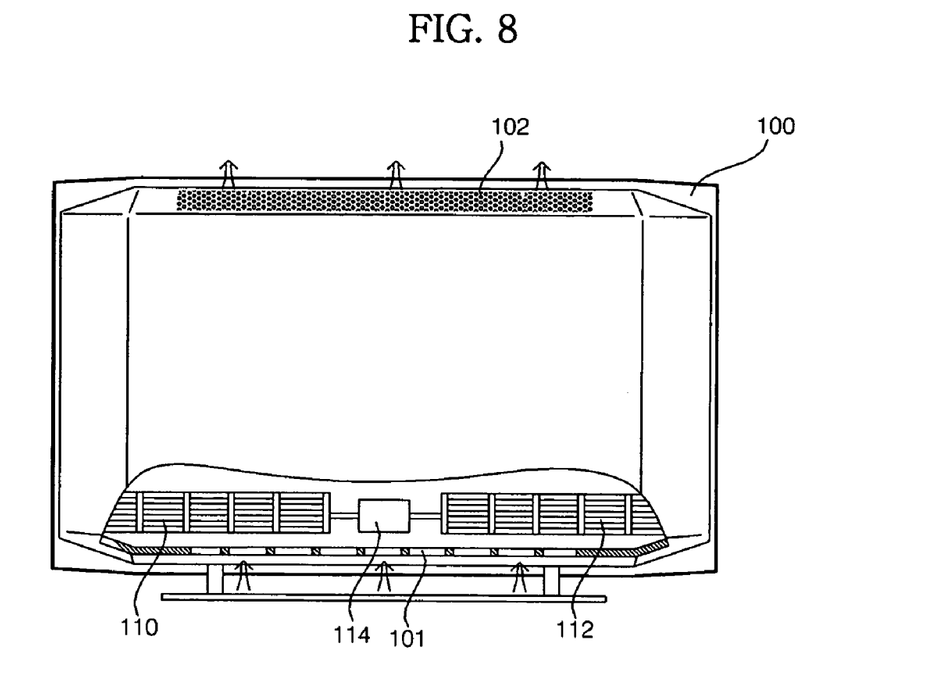
FIG. 8 is a rear view illustrating a display device and a blower thereof in accordance with a second embodiment of the present invention.

FIG. 8 is a rear view illustrating a display device and a blower thereof in accordance with a second embodiment of the present invention.

According to the second embodiment, the display device comprises a case 100 which has a display panel encased therein. The case 100 has an air inlet 101 formed at a lower portion of a rear side, an air outlet 102 formed at an upper surface of the case 100, a plurality of axial flow fans 110 and 112 positioned at a lower portion within the case 100, and a fan motor 114 positioned at the lower portion to rotate the axial flow fans 72.

Although the display device of the second embodiment comprises two or more axial flow fans, the following description will be limited to the case where the display device comprises two axial flow fans 110 and 112.

The two axial flow fans 110 and 112 are arranged linearly in the left and right direction of the case 100 such that each of the axial flow fans 110 and 112 has a shaft disposed in the left and right direction within the case 100.

Although the display device of this embodiment may have one or more fan motors 114, the following description will be limited to a single fan motor 114.

The single fan motor 114 is positioned between the two axial flow fans 110 and 112 to simultaneously rotate the two axial flow fans 110 and 112.

Since other components of the second embodiment are the same as those of the first embodiment, detailed description thereof will be omitted hereinafter.

The display device and the blower thereof according to the second embodiment have the same advantageous effects in heat dissipation as those of the first embodiment.

Figure 9:
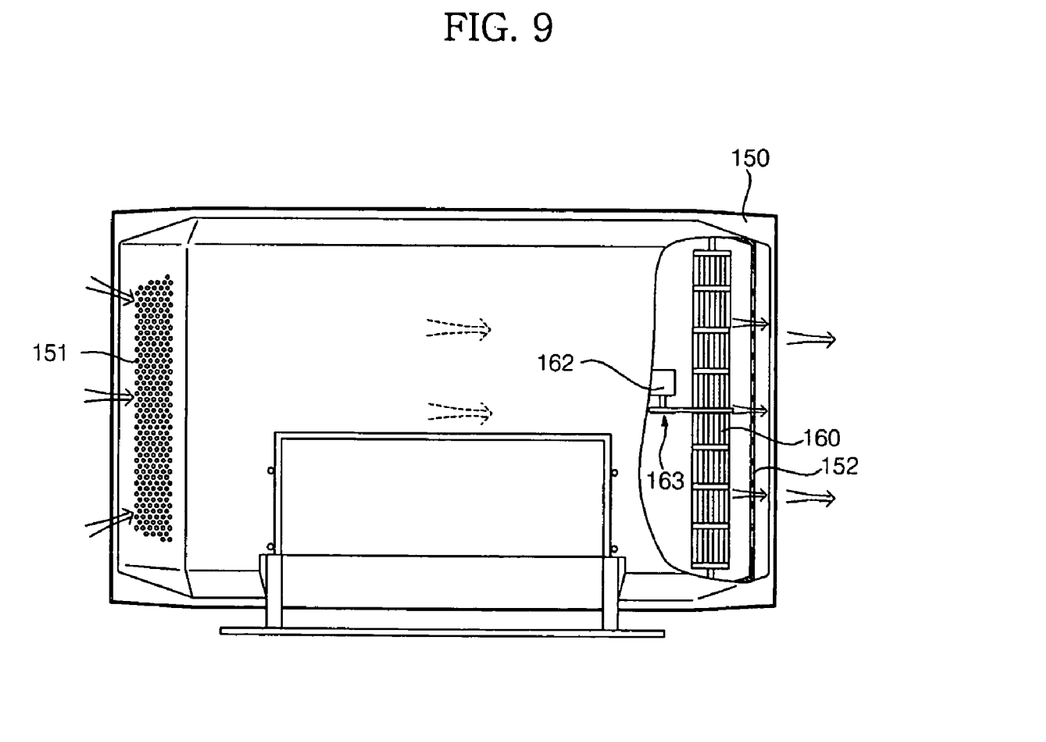
FIG. 9 is a rear view illustrating a display device and a blower thereof in accordance with a third embodiment of the present invention.

FIG. 9 is a rear view illustrating a display device and a blower thereof in accordance with a third embodiment of the present invention.

According to the third embodiment, the display device comprises a case 150 which has a display panel encased therein. The case 150 has an air inlet 151 formed at a left side of a rear side, an air outlet 152 formed at a right side of the rear side, an axial flow fan 160 positioned at a right side within the case 150, and a fan motor 162 indirectly connected with the axial flow fan 160 within the case 150 to rotate the axial flow fan 160.

The fan motor 162 is positioned at the left side of the axial flow fan 162, and is indirectly connected thereto via a pulley belt 163 and the like.

Since other components of the third embodiment are the same as those of the first embodiment, detailed description thereof will be omitted hereinafter.

In the display device and the blower thereof according to the third embodiment, forced air flow is widely generated in the upper and lower direction by the axial flow fan 160 within the case 50, thereby achieving enhanced heat dissipation, reduced noise, simplification in construction, and reduced manufacturing costs of the display device.

Figure 10:
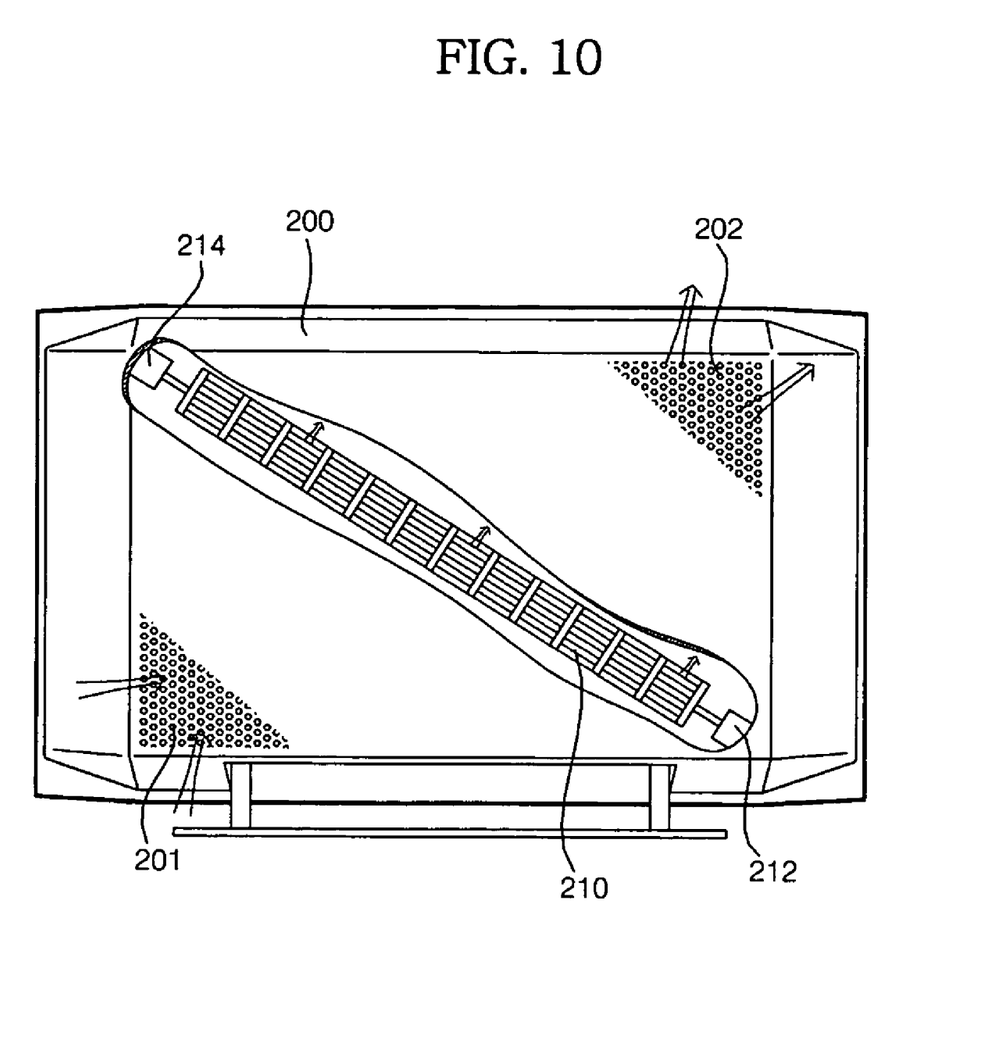
FIG. 10 is a rear view illustrating a display device and a blower thereof in accordance with a fourth embodiment of the present invention.

FIG. 10 is a rear view illustrating a display device and a blower thereof in accordance with a fourth embodiment of the present invention.

According to the fourth embodiment, the display device comprises a case 200 which has a display panel encased therein. The case 200 has an air inlet 201 formed at a lower portion of a rear side, an air outlet 202 formed at an upper portion of the rear side, and an axial flow fan 210 diagonally positioned within the case 150.

A plurality of fan motors 212 and 214 is provided within the case 200 to rotate the axial flow fan 210.

The display device of the fourth embodiment includes two fan motors 212 and 214 such that the fan motors 212 and 214 are positioned at both ends of the axial flow fan 210 in the axial direction of the axial flow fan 210.

Since other components of the fourth embodiment are the same as those of the first embodiment, detailed description thereof will be omitted hereinafter.

In the display device and the blower thereof according to the fourth embodiment, the forced air flow is widely generated in the diagonal direction by the axial flow fan 210 within the case 50, thereby achieving enhanced heat dissipation, reduced noise, simplification in construction, and reduced manufacturing costs of the display device.

It should be understood that the embodiments and the accompanying drawings have been described for illustrative purposes and the present invention is limited by the following claims. Further, those skilled in the art will appreciate that various modifications, additions and substitutions are allowed without departing from the scope and spirit of the invention according to the accompanying claims.

What is claimed is:

1. A display device, comprising:
   a case having a display panel provided therein, wherein the case is provided with an air inlet and an air outlet; and
   a fan provided within the case, the fan comprising a rotation shaft and a plurality of rotatable fan plates spaced from each other along a rotation shaft of the fan and a plurality of rotatable fan blades positioned between the fan plates,
   wherein the fan blades are oriented circumferentially about the rotation shaft of the fan and extend in a direction substantially parallel to the rotation shaft,
   wherein the fan is configured to suck air into the case through the air inlet and along a periphery of the fan blades,
   wherein the air sucked into the case is directed towards the air outlet and discharged from the case, and
   the rotation shaft generally diagonally extends from one corner of the case to an opposite corner of the case.

2. The display device according to claim 1, wherein the display panel comprises a flat display panel.

3. The display device according to claim 1, wherein a thickness of the case is smaller than a width of the case.

4. The display device according to claim 3, wherein the air outlet is provided at an upper side of the case and the air inlet is provided at a lower side of the case.

5. The display device according to claim 1, wherein the case has an upper surface, at least a rear portion of which is slanted from a front side towards a rear side of the case.

6. The display device according to claim 1, wherein the fan comprises a shaft extending in a width direction of the case.

7. The display device according to claim 1, further comprising:
   a fan motor configured to drive the fan, wherein the fan motor is aligned with the rotation shaft of the fan.

8. The display device according to claim 1, wherein the air inlet is provided at a lower portion of a rear side of the case and the air outlet is provided at an upper surface of the case.

9. The display device according to claim 1, wherein a fan motor configured to drive the fan is coupled to the fan via a pulley belt.

10. The display device according to claim 1, wherein the fan comprises two fans with a fan motor configured to drive the fans, and wherein the motor is positioned axially between the fans.

11. The display device according to claim 1, further comprising two fan motors configured to drive the fan and each positioned at opposing ends of the rotation shaft of the fan.

12. The display device according to claim 11, wherein one of the two fan motors is disposed at the one corner of the case, and wherein the other of the two fan motors is disposed at the opposite corner of the case.

13. The display device according to claim 1, wherein the one corner of the case is a upper corner and wherein the opposite corner of the case is a lower corner.

* * * * *